(12) United States Patent
Tanaka et al.

(10) Patent No.: US 9,881,783 B2
(45) Date of Patent: Jan. 30, 2018

(54) METHOD FOR PROCESSING SEMICONDUCTOR WAFER

(71) Applicant: SUMCO CORPORATION, Tokyo (JP)

(72) Inventors: Toshiyuki Tanaka, Takeo (JP); Yasuyuki Hashimoto, Karatsu (JP); Tomohiro Hashii, Imari (JP)

(73) Assignee: SUMCO CORPORATION, Tokyo (JP)

( * ) Notice: Subject to any disclaimer, the term of this patent is extended or adjusted under 35 U.S.C. 154(b) by 332 days.

(21) Appl. No.: 14/439,893

(22) PCT Filed: Feb. 4, 2014

(86) PCT No.: PCT/JP2014/052540
§ 371 (c)(1),
(2) Date: Apr. 30, 2015

(87) PCT Pub. No.: WO2014/129304
PCT Pub. Date: Aug. 28, 2014

(65) Prior Publication Data
US 2015/0303049 A1    Oct. 22, 2015

(30) Foreign Application Priority Data

Feb. 19, 2013    (JP) .................................. 2013-029719

(51) Int. Cl.
*B24B 37/08*    (2012.01)
*H01L 21/02*    (2006.01)
(Continued)

(52) U.S. Cl.
CPC ........ *H01L 21/02013* (2013.01); *B24B 7/228* (2013.01); *B24B 27/0633* (2013.01);
(Continued)

(58) Field of Classification Search
CPC .............. H01L 21/02013; B24B 7/228; B24B 27/0633; B24B 37/08; B24B 37/107
(Continued)

(56) References Cited

U.S. PATENT DOCUMENTS 6,077,149 A * 6/2000 Ohkuni ................. B24B 37/042
451/285
6,284,658 B1 * 9/2001 Kato ................. H01L 21/02008
257/E21.214
(Continued)

FOREIGN PATENT DOCUMENTS

JP    10-256203    9/1998
JP    2004-63883    2/2004
(Continued)

OTHER PUBLICATIONS

Office Action issued in Korea Counterpart Patent Appl. No. 10-2015-7005423, dated Dec. 10, 2015, along with an Eenglish translation thereof.
(Continued)

*Primary Examiner* — Eileen Morgan
(74) *Attorney, Agent, or Firm* — Greenblum & Bernstein, P.L.C.

(57) ABSTRACT

In a wafer processing method by which, by using, as a reference surface, a flat surface obtained by applying a curable material to the whole of one surface of a wafer obtained by slicing a semiconductor single-crystal ingot by using a wire saw apparatus, surface grinding is performed on the other surface of the wafer and surface grinding is performed on the one surface of the wafer by using the other surface of the wafer subjected to surface grinding as a reference surface, both surfaces of the wafer are planarized at the same time immediately after the wafer is obtained by slicing.

5 Claims, 8 Drawing Sheets (51) Int. Cl.
*B24B 27/06* (2006.01)
*B24B 37/10* (2012.01)
*B24B 7/22* (2006.01)
*B28D 5/04* (2006.01)

(52) U.S. Cl.
CPC ............ *B24B 37/08* (2013.01); *B24B 37/107* (2013.01); *B28D 5/045* (2013.01)

(58) Field of Classification Search
USPC .......................................... 451/41, 285, 287
See application file for complete search history.

(56) References Cited

U.S. PATENT DOCUMENTS

| | | | | |
|---|---|---|---|---|
| 6,465,328 | B1* | 10/2002 | Hashii ...................... | B24B 1/00 257/E21.214 |
| 6,491,836 | B1* | 12/2002 | Kato ........................ | B24B 7/228 216/88 |
| 2002/0115294 | A1* | 8/2002 | Watanabe ............. | H01L 21/304 438/690 |
| 2003/0170920 | A1 | 9/2003 | Bhagavat et al. | |
| 2005/0095963 | A1* | 5/2005 | Stark ........................ | B24B 57/02 451/259 |
| 2006/0258268 | A1* | 11/2006 | Miyata .................... | B28D 5/045 451/41 |
| 2007/0060027 | A1* | 3/2007 | Kobayashi ............. | B24B 37/102 451/57 |
| 2007/0155294 | A1 | 7/2007 | Stark et al. | |
| 2010/0006982 | A1* | 1/2010 | Hashii .................... | B24B 37/042 257/618 |
| 2011/0045246 | A1* | 2/2011 | Tahara .................... | C30B 29/06 428/141 |
| 2012/0168802 | A1* | 7/2012 | Hirotsuru ................ | C04B 35/52 257/98 |
| 2012/0315739 | A1* | 12/2012 | Hashii ...................... | B24B 9/065 438/460 |
| 2013/0203324 | A1* | 8/2013 | Hasegawa ................ | B24B 1/00 451/41 |
| 2015/0004799 | A1* | 1/2015 | Tanaka .............. | H01L 21/02013 438/759 |

FOREIGN PATENT DOCUMENTS

| | | |
|---|---|---|
| JP | 2006-269761 | 10/2006 |
| JP | 2007-221030 | 8/2007 |
| JP | 2009-148866 | 7/2009 |
| JP | 2009-272557 | 11/2009 |
| JP | 2010-16078 | 1/2010 |
| JP | 2010016078 A * | 1/2010 ............ C30B 29/06 |
| JP | 2011-103379 | 5/2011 |
| JP | 2011-151099 | 8/2011 |
| JP | 2011-249652 | 12/2011 |
| KR | 10-2009-0117612 | 11/2009 |
| KR | 10-2012-0091371 | 8/2012 |
| TW | 200527523 | 8/2005 |
| TW | 200718509 | 5/2010 |
| TW | 201134628 | 10/2011 |
| TW | 201246341 | 11/2012 |
| WO | 2011/032602 | 3/2011 |
| WO | 2011/105255 | 9/2011 |

OTHER PUBLICATIONS

Office Action issued in Japan Counterpart Patent Appl. No. 2015-501387, dated May 17, 2016 , along with an English translation thereof.
Office Action issued in Japan Counterpart Patent Appl. No. 2015-501387, dated Mar. 14, 2017 (No. 115451) , along with an English translation thereof.
Office Action issued in Japan Counterpart Patent Appl. No. 2015-501387, dated Mar. 14, 2017(No. 115450) , along with an English translation thereof.
International Preliminary Report on Patentability for PCT/JP2014/052540, dated Aug. 25, 2015.
Taiwanese Office Action dated Jun. 4, 2015 in Taiwan Patent Application No. 103104550 along with an English translation thereof.
International Search Report, dated Apr. 28, 2014.
Office Action issued in China Counterpart Patent Appl. No. 201480002327.0, dated Jul. 19, 2016 , along with an English translation thereof.
Office Action issued in China Counterpart Patent Appl. No. 201480002327.0, dated Mar. 9, 2017 , along with an English translation thereof.
Office Action issued in Japan Counterpart Patent Appl. No. 2015-501387, dated Mar. 14, 2017 (No. 115451), along with an English translation thereof.
Office Action issued in Japan Counterpart Patent Appl. No. 2015-501387, dated Mar. 14, 2017(No. 115450), along with an English translation thereof.

* cited by examiner

METHOD FOR PROCESSING SEMICONDUCTOR WAFER

TECHNICAL FIELD

The present invention relates to methods for processing a semiconductor wafer and, in particular, to a processing method for planarizing the surface of a semiconductor wafer. Incidentally, this international application claims priority to Japanese Patent Application No. 029719 (No. 2013-029719), filed on Feb. 19, 2013, the contents of which are hereby incorporated by reference.

BACKGROUND ART

In the past, a semiconductor wafer has been required to be a wafer with a planarized surface in order to create a fine pattern by a photomechanical process. In particular, surface waves called "nanotopography" are waves having components with wavelengths $\lambda=0.2$ to 20 mm, the waves whose PV values (Peak to Valley values) are 0.1 to 0.2 μm or less, and, recently, a technique of improving the flatness of a semiconductor wafer by reducing this nanotopography has been proposed. As such a wafer planarization method, a processing method including a primary grinding step of grinding a second surface of a wafer with a first surface of the wafer obtained by slicing an ingot being held on a horizontally holding surface of a chuck table by suction and then grinding the first surface of the wafer with the second surface of the wafer being held on the horizontally holding surface by suction, a resin applying step of covering, after the primary grinding step, the whole of the second surface of the wafer with resin, and a step of grinding, after the resin applying step, the first surface of the wafer with the second surface of the wafer being held on the horizontally holding surface by suction by using the second surface of the wafer as a reference surface and, after removing the resin, grinding the second surface of the wafer by using the first surface of the wafer as the reference surface has been disclosed (refer to, for example, Patent Document 1).

Patent Document 1: JP-A-2011-249652 (claim 1, paragraphs [0008], [0028], and FIG. 2)

SUMMARY OF THE INVENTION

Problem to be Solved by the Invention

In the primary grinding step described in Patent Document 1 mentioned above, grinding of the wafer surface on the non-sticking surface side is performed in a state in which a flat reference surface is created, the flat reference surface whose large waves generated in the slicing step were forcedly corrected by holding the wafer on the holding surface by suction in order to remove a distortion component generated at the time of slicing. As a result, grinding is performed in a state in which the wafer is elastically deformed, when holding by suction is terminated after grinding, the waves on the wafer surface on the sticking surface side on which grinding processing has not been performed return to the state before sticking holding, these waves are transferred to the wafer surface on the non-sticking surface side, the wafer surface planarized by grinding, and most of the waves eventually remain on the wafer surface.

Thus far, even when the waves remain on the wafer surface, since grinding processing is then performed such that the waves are removed in a state in which a flat reference surface is created by the resin applied to the wafer surface in the resin applying step, the surface state of the wafer before the resin applying step has not been acknowledged as a problem. However, according to the experiment conducted by the inventors, it has been found out that, even when processing (resin application grinding) obtained as a combination of the resin application processing and the grinding processing described in Patent Document 1 is performed, if the waves on the wafer surface before the resin applying step are large, the nanotopography quality of the wafer surface following mirror-polishing processing is not sufficient.

Moreover, when a single-crystal ingot is sliced by a wire saw in the slicing step, in general, a semiconductor ingot is cut into a large number of semiconductor wafers with slurry (processing fluid) containing free abrasive grains being supplied to a wire line running to and fro; if a fixed abrasive grain wire with an outer periphery to which abrasive grains are fixed is used, it is possible to cut the single-crystal ingot at higher speed than that in a case where free abrasive grains are used. However, the inventors have found out that, when the fixed abrasive grain wire is used, processing damage is significant and waves generated on the wafer surface after cutting become excessively large, which arises a problem of further deteriorated nanotopography.

An object of the present invention is to produce a semiconductor wafer having good nanotopography characteristics (with a smaller value) by performing, in a secondary grinding step, surface grinding on a wafer whose waves were reduced in a primary grinding step.

Means for Solving Problem

Through an intensive study to achieve the above-described object, the inventors have found out that the nanotopography quality of a resultant semiconductor wafer varies greatly depending on the surface state (the magnitude of waves) of a wafer before it is coated with a soft material and is subjected to surface grinding, and completed the present invention. Specifically, after alleviating wave components in a specific wavelength range (10 to 100 mm) in advance by performing concurrent double-side planarization without a reference surface such as lapping or double-head grinding immediately after slicing, by performing coating with a soft material and surface grinding, a slice wave pattern is removed and the quality level of the nanotopography of a wafer is improved.

A first aspect of the present invention is providing a slicing step of obtaining a thin disk-shaped wafer by slicing a semiconductor single-crystal ingot by using a wire saw apparatus; a double-side planarizing step of performing planarization on both surfaces of the wafer following the slicing step at the same time; an application layer forming step of forming a flat application layer by applying a curable material to the whole of one surface of the wafer following the double-side planarizing step; a first surface grinding step of placing the wafer on a table in such a way that the one surface of the planarized wafer makes contact with a reference surface of the table of a grinding device and then performing surface grinding on the other surface of the wafer by the grinding device; an application layer removing step of removing the application layer following the surface grinding step from the one surface of the wafer; and a second surface grinding step of placing the wafer on the table in such a way that the other surface of the wafer from which the application layer is removed makes contact with the reference surface of the table of the grinding device and then performing surface grinding on the one surface of the wafer by the grinding device.

A second aspect of the present invention is the invention based on the first aspect in which the wire saw apparatus adopts a slicing type using a fixed abrasive grain wire.

A third aspect of the present invention is the invention based on the first aspect in which, as the double-side planarizing step, double-side lapping processing or double-head grinding processing is adopted.

A fourth aspect of the present invention is the invention based on the first aspect in which the thickness of the application layer which is applied to the wafer surface in the application layer forming step is set to 10 to 40 µm.

A fifth aspect of the present invention is the invention based on the first aspect in which, when frequency analysis is performed on the surface height of the wafer following the double-side planarizing step, the amplitude of a wave in a wavelength region of 100 mm or less is set in the range of 1.0 µm or less.

A sixth aspect of the present invention is the invention based on the second aspect in which, when frequency analysis is performed on the surface height of the wafer following the double-side planarizing step, the amplitude of a wave in a wavelength region of 100 mm or less is set in the range of 1.0 µm or less.

A seventh aspect of the present invention is the invention based on the third aspect in which, when frequency analysis is performed on the surface height of the wafer following the double-side planarizing step, the amplitude of a wave in a wavelength region of 100 mm or less is set in the range of 1.0 µm or less.

An eighth aspect of the present invention is the invention based on the fourth aspect in which, when frequency analysis is performed on the surface height of the wafer following the double-side planarizing step, the amplitude of a wave in a wavelength region of 100 mm or less is set in the range of 1.0 µm or less.

EFFECT OF THE INVENTION

With the method for processing a semiconductor wafer according to the present invention, by planarizing both surfaces of a wafer after slicing at the same time, it is possible to reduce the waves in a wavelength region that affect the nanotopography quality as much as possible and provide a semiconductor wafer with good nanotopography quality.

In particular, even when a wafer with large waves, the wafer cut by using a wire saw apparatus of the fixed abrasive grain type, it is possible to reduce the waves as much as possible and provide a semiconductor wafer with good nanotopography quality.

BEST MODE FOR CARRYING OUT THE INVENTION

Next, a mode for carrying out the present invention will be described based on the drawings.

As depicted in FIG. 1(a) to (f), the present invention is an improvement of a processing method by which the surface of a semiconductor wafer is planarized, the processing method that processes the semiconductor wafer by a slicing step of obtaining a thin disk-shaped wafer by slicing a semiconductor single-crystal ingot by using a wire saw apparatus, a double-side planarizing step of performing planarization on both surfaces of the wafer following the slicing step at the same time, an application layer forming step of forming a flat application layer by applying a curable material to the whole of one surface of the wafer following the double-side planarizing step, a first surface grinding step of placing the wafer on a table in such a way that the one surface of the planarized wafer makes contact with a reference surface of the table of a grinding device and then performing surface grinding on the other surface of the wafer by the grinding device, an application layer removing step of removing the application layer following the surface grinding step from the one surface of the wafer, and a second surface grinding step of placing the wafer on the table in such a way that the other surface of the wafer from which the application layer is removed makes contact with the reference surface of the table of the grinding device and then performing surface grinding on the one surface of the wafer by the grinding device. Incidentally, a step of chamfering the outer edge of the semiconductor wafer is not depicted, but the chamfering step may be performed between any steps from a point after FIG. 1(a) to a point after (f).

Figure 1:
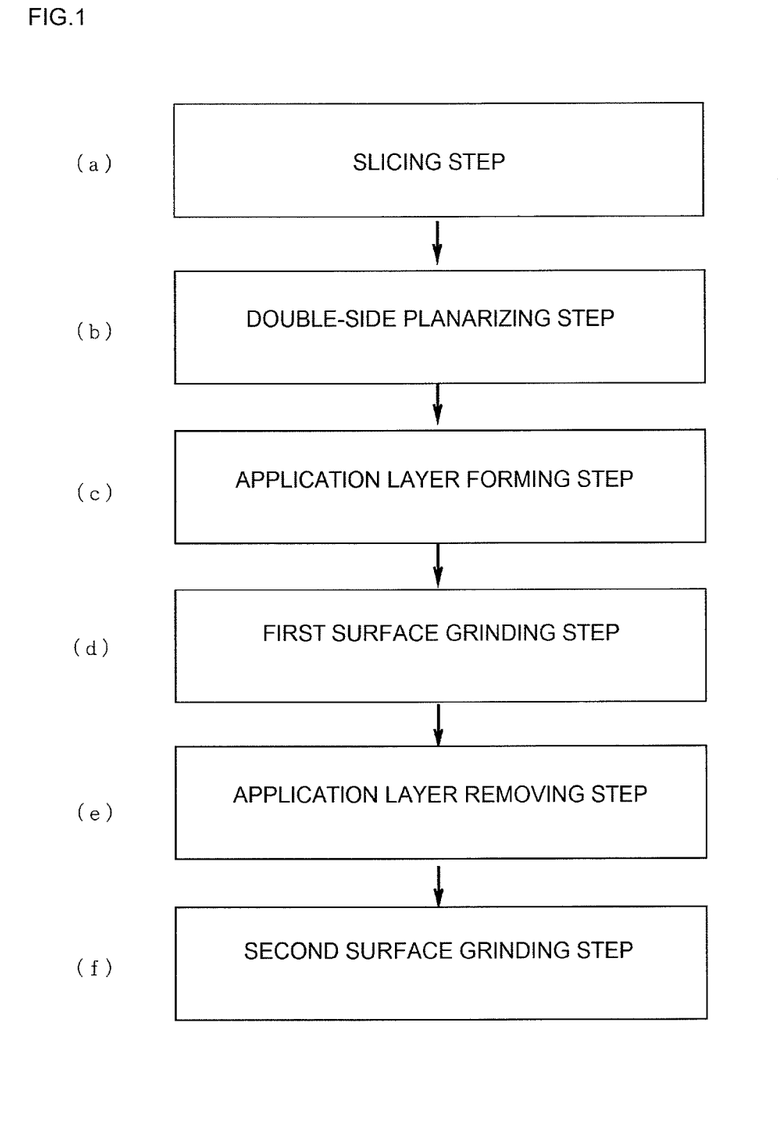
FIG. 1 is a diagram for explaining an outline of a wafer processing method according to an embodiment of the present invention.

As depicted in FIG. 1(a) to (c), the characteristic configuration of the present invention is to provide the double-side planarizing step of planarizing both surfaces of the wafer following the slicing step at the same time before the application layer forming step. By performing concurrent double-side planarization without a reference surface before the application layer forming step, projections on both surfaces of the wafer are removed at the same time, and wave components in a wavelength range of 100 mm or less are reduced as much as possible. This makes it possible to improve the nanotopography characteristics of the wafer surface and also reduce the thickness of the application layer which is applied to the wafer surface in the application layer forming step.

An embodiment of the present invention will be described in detail with referent to FIG. 2. In FIG. 2(a), the state of a wafer 200 immediately after slicing is depicted. An unillustrated publicly-known multi-wire saw apparatus is used for slicing, and a plurality of wafers 200 can be produced from an ingot at one time. The multi-wire saw apparatus has a plurality of wires which are extra fine steel wires, the plurality of wires wound around a guide roller provided with a plurality of grooves guiding the wires and a roller for rotating the wires. This apparatus is an apparatus that cuts an object to be cut into a plurality of pieces by rotating the roller at high speed and pressing the object to be cut against the plurality of wires exposed between the guide roller and the roller. As the wire saw apparatus, depending on how to use abrasive grains for performing cutting, there are a fixed abrasive grain type and a free abrasive grain type. The fixed abrasive grain type uses, as the wire, a steel wire to which diamond abrasive grains or the like are made to adhere by vapor deposition or the like. The free abrasive grain type is used with slurry which is a mixture of abrasive grains and a lubricant being poured on the wire. Since the wire itself with the abrasive grains adhering thereto cuts an object to be cut, the fixed abrasive grain type achieves a shorter cutting time and is excellent in productivity. Moreover, since no slurry is used and therefore there is no need to discard the slurry containing the chips caused by cutting, the fixed abrasive grain type is good for the environment and is economical. Although the present invention can be embodied by using either of the two types, it is preferable to use the fixed abrasive grain type that has advantages in environmental and economical terms. Incidentally, when a fixed abrasive grain wire saw is used, a problem of further deteriorated nanotopography arises because processing damage to the wafer surface is significant and waves that develop on the wafer surface after cutting become large, but the use of the processing method of the present invention makes it possible to produce a semiconductor wafer having good nanotopography characteristics (with a smaller value).

Figure 2:
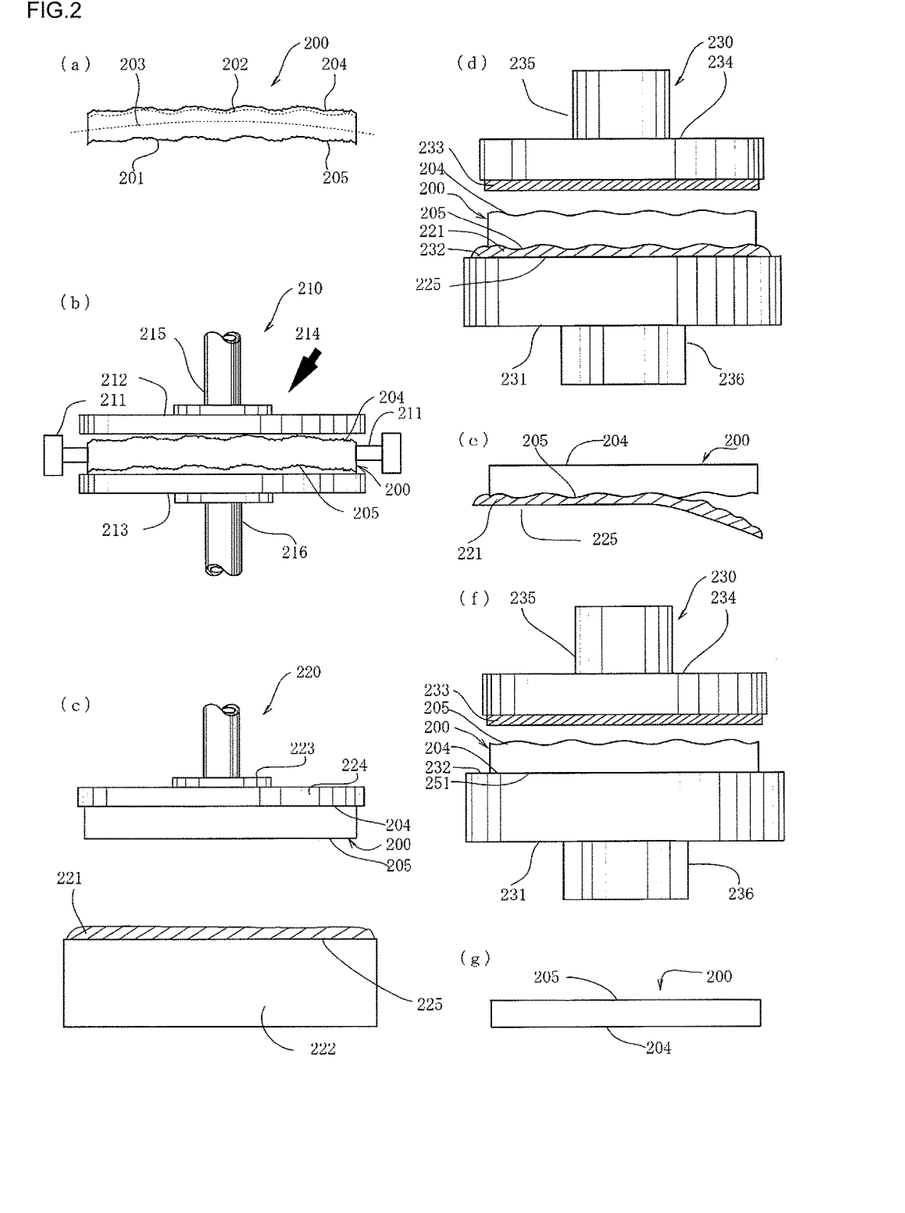
FIG. 2 is a schematic diagram depicting an example of the state of a wafer and an apparatus which is used in each step from a wafer after slicing to a wafer after surface grinding according to the embodiment of the present invention.

In FIG. 2(a), the state of the wafer 200 immediately after slicing, the wafer 200 cut by the fixed abrasive grain wire saw, is depicted. In the wafer 200 obtained by slicing, processing distortion (a processing damage layer) 201, waves 202 which are periodically undulating depressions and projections, and warping 203 appear due to wire saw cutting processing. For the sake of convenience, it is assumed that a top surface of FIG. 2(a) which is located on the side of the wafer 200 where the convex surface of the warping 203 is located is referred to as a first surface 204 and a lower surface of FIG. 2(a) which is located on the side of the wafer 200 where the concave surface of the warping 203 is located is referred to as a second surface 205.

FIG. 2(b) is a diagram depicting an example of a lapping device 210 which is used for lapping in double-side planarization. The wafer 200 set on a processing carrier 211 is sandwiched between two surface plates of the lapping device 210, and, as a result of spindles 215 and 216 placed in an upper part of an upper surface plate 212 and a lower part of a lower surface plate 213, respectively, being rotated in opposite directions with slurry 214 containing abrasive grains being supplied between the upper surface plate 212 and the lower surface plate 213 and pressure being applied by the upper and lower surface plates, the first surface 204 and the second surface 205 are planarized at the same time by the abrasive grains contained in the slurry 214.

After lapping, the wafer 200 is removed from the surface plates and is removed from the processing carrier 211.

Since the wafer 200 following the lapping step (the double-side planarizing step) is then subjected to planarization such that both surfaces of the wafer 200 are planarized again by a surface grinding step (first surface grinding and second surface grinding), as for the amount of processing (removal amount) for the wafer 200 in the lapping step, there is no need to perform planarization until all the processing distortion 201 of the wafer 200 that occurred in the slicing step is removed, and, as is clear from Example which will be described later, it is simply necessary to perform lapping processing in such a way that the amplitude of waves in the wavelength range of 100 mm or less becomes 1.0 µm or less when frequency analysis is performed on the surface height of the wafer 200 following lapping.

Incidentally, the concurrent double-side planarization is not limited to the lapping processing described above. Though not depicted in the drawing, publicly-known double-head grinding processing by which the wafer 200 is attached to the processing carrier 211 and both surfaces of the wafer 200 are ground at the same time by grindstones which perform surface grinding, the grindstones placed above and below the wafer 200 and publicly-known fixed abrasive grain lapping processing by which pads with fixed abrasive grains contained therein are attached to the upper and lower surface plates of the lapping device 210 and both surfaces of the wafer 200 are ground at the same time by the fixed abrasive grains with or without the slurry 214 may be used.

In FIG. 2(c), an example of a holding and pressing device 220 which is used in the application layer forming step is depicted. First, a curable material 221 which will become an application layer is dropped on a highly planarized flat plate 222 of the holding and pressing device 220. On the other hand, as for the wafer 200, the first surface 204 of the wafer 200 is held on a pressing table 224 of a holding unit 223 by suction and the second surface 205 of the wafer 200 is pushed against the curable material 221 by moving the pressing table 224 downward. Then, the pressure applied by the pressing table 224 is released and, in a state in which elastic deformation is not caused in the warping 203 and the waves 202 remaining in the wafer 200, the curable material 221 is cured on the second surface 205 of the wafer 200. As a result of this step, the surface of the curable material 221 making contact with the flat plate 222 becomes a highly planarized surface and can be used as a reference surface 225 which is used when the first surface 205 of the wafer 200 is ground.

As the method of applying the curable material 221 to the wafer 200, in addition to a method using spin coating by which the curable material 221 is dropped on the second surface 205 with the second surface 205 of the wafer 200 used as the top surface and the wafer 200 is rotated, thereby spreading the curable material 221 across the second surface 205 or screen printing by which a screen film is provided on the second surface 205 and the curable material 221 is put on the screen film and is pushed thereinto by a squeegee and a method by which, after application is performed by, for example, a method of performing spraying on the whole of the second surface 205 by electric spray deposition, the application surface is made to contact with and pressed against the highly planarized flat plate 222, the method is not limited to the methods described above, and a method of highly planarizing one surface of the wafer 200 by the curable material 221 can be applied. As the curable material 221, soft materials such as a thermosetting resin, a thermoreversible resin, and a photosensitive resin are desirable because they easily exfoliate after processing. In particular, the photosensitive resin is suitable because stress by heat is not applied. In this example, as the curable material 221, a UV curable resin is used. Moreover, examples of other specific materials of the curable material 221 include synthetic rubber and an adhesive (such as wax).

As for the thickness of the curable material 221 which is applied to the wafer 200, the larger the projections on the surface of the wafer 200 (the larger the wave components in the wavelength range of 100 mm or less), the thicker the curable material 221 which is applied to the wafer 200 has to be, and it is generally known that the thickness of the curable material 221 which is applied to the wafer 200 is set to the range of 50 to 150 µm, but the curable material 221 is expensive, and an increase in the amount of the curable material 221 used undesirably increases production cost.

In the present invention, since the concurrent double-side planarization without a reference surface is performed before the application layer forming step, the projections on both surfaces of the wafer 200 are removed at the same time, and the wave components in the wavelength range of 100 mm or less are reduced. As a result, it is possible to reduce the thickness of the curable material 221 which is applied to the wafer 200, and, in the present invention, it is possible to set the thickness of the curable material 221 to the range of 10 to 40 µm. Incidentally, if the thickness of the curable material 221 is less than 10 µm, the influence of the projections on the surface of the wafer 200 worsens the nanotopography quality.

In FIG. 2(d), an example of a surface grinding device 230 which is used in the first surface grinding step is depicted. First, the reference surface 225 by the curable material 221 formed in the application layer forming step is placed on a highly planarized reference surface 232 of a vacuum chuck table 231 of the surface grinding device 230 and is held thereon by suction. Then, on the top surface of the wafer 200 thus placed, a surface plate 234 with one surface on which a grindstone 233 is placed is placed. Next, the grindstone 233 and the first surface 204 of the wafer 200 are brought into contact with each other, and, as a result of a spindle 235 on top of the surface plate 234 and a spindle 236 placed at the bottom of the vacuum chuck table 231 rotating and contact points between the grindstone 233 and the first surface 204 of the wafer 200 rotating while making contact with each other, the first surface 204 of the wafer 200 is ground and the first surface 204 is highly planarized.

In FIG. 2(e), the application layer removing step is depicted. The curable material 221 applied to the second surface 205 of the wafer 200 whose first surface 204 of the wafer 200 was highly planarized in the first surface grinding step is torn from the wafer 200. The removal of the curable material 221 which is the application layer may be chemical removal using a solvent.

In FIG. 2(f), an example of the second surface grinding step is depicted. A device that performs surface grinding is the same device as the surface grinding device 230 used in the first surface grinding step. The first surface 204 of the wafer 200 which was highly planarized in the first surface grinding step is placed, as a reference surface 251, on the highly planarized reference surface 232 of the vacuum chuck table 231 and is held thereon by suction. The second surface 205 of the wafer 200 is ground until the second surface 205 of the wafer 200 is highly planarized as in the first surface grinding step. As depicted in FIG. 2(g), both surfaces of the wafer 200 are highly planarized.

EXAMPLES

Next, Example of the present invention will be described in detail along with Comparative Examples.

Incidentally, as wafers 200 used in Example and Comparative Examples 1 and 2, wafers 200 having a diameter of 300 mm, the wafers 200 obtained from a silicon single-crystal ingot by slicing it under the same condition by using a fixed abrasive grain type wire saw apparatus, were used.

Example

Figure 3:
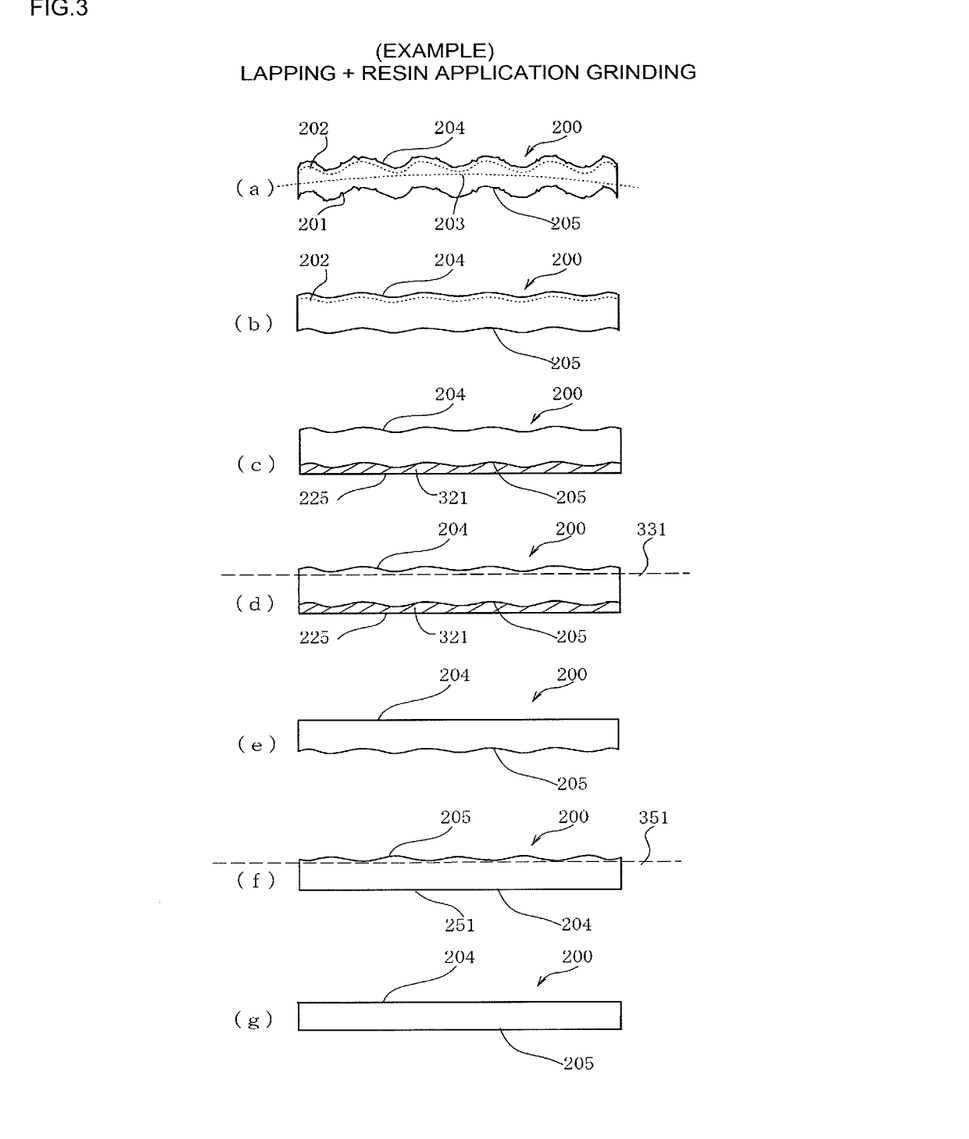
FIG. 3 is a schematic diagram depicting the state of a wafer in each step according to the embodiment of the present invention.

Example of the present invention is depicted in FIG. 3. Processing steps of Example will be described based on FIG. 3. Both surfaces of a wafer 200 after slicing (FIG. 3(a)) were ground at the same time by lapping and waves 202 were reduced (FIG. 3(b)). A UV curable resin 321 was applied to a second surface 205 of the wafer 200 in which the waves 202 were reduced, and a surface of a cured resin having a thickness of 35 µm was used as a reference surface 225 (FIG. 3(c)). A first surface 204 of the wafer 200 held by suction by using the surface of the resin as the reference surface 225 was ground until the waves 202 were eliminated (to a surface indicated by a broken line 331) (FIG. 3(d)). Next, the resin was torn (FIG. 3(e)), and surface grinding was performed on the second surface 205 of the wafer 200 to a surface indicated by a broken line 351, the wafer 200 held by suction by using the first surface 204 of the wafer 200 subjected to surface grinding as a reference surface 251 (FIG. 3(f)). All the steps were finished, and the wafer 200 whose both surfaces of the wafer were highly planarized was obtained. This wafer 200 was used as the wafer 200 of Example (FIG. 3(g)).

Comparative Example 1

Figure 4:
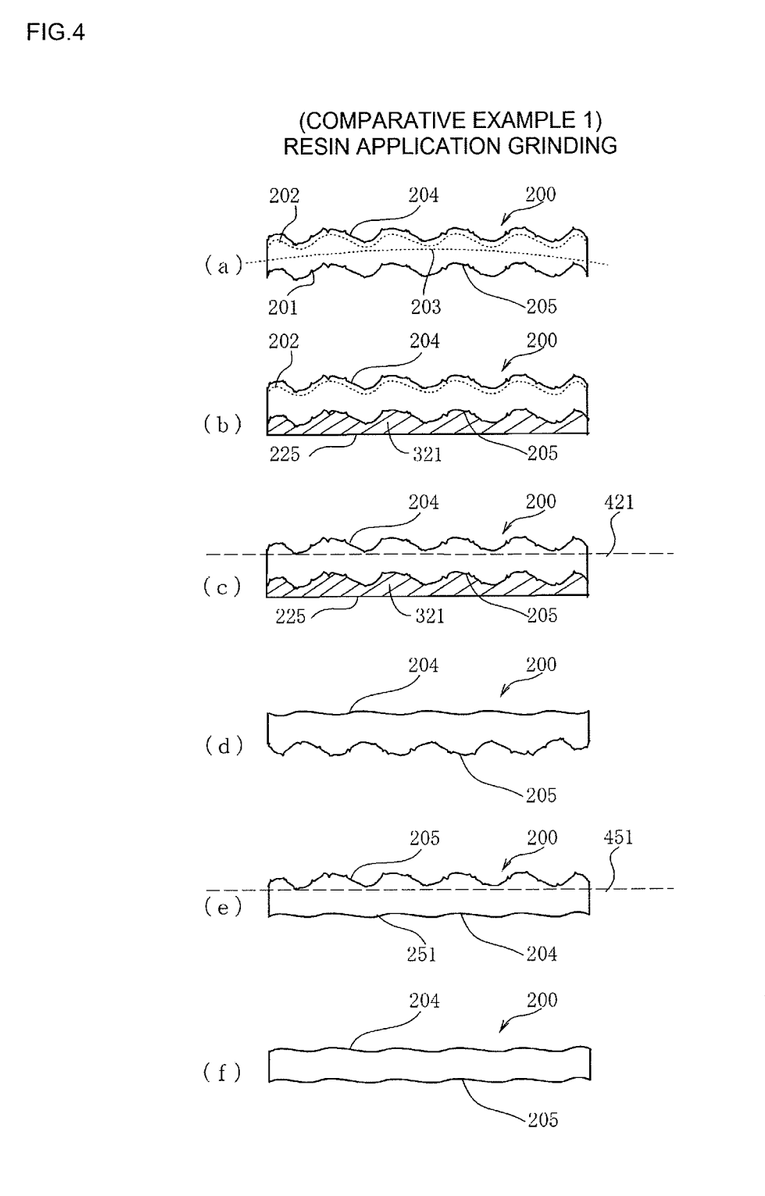
FIG. 4 is a schematic diagram depicting the state of a wafer in each step according to Comparative Example 1.

Comparative Example 1 is depicted in FIG. 4. Processing steps of Comparative Example 1 will be described based on the drawings. A UV curable resin 321 was applied to a second surface 205 of a wafer 200 after slicing (FIG. 4(a)), and a surface of a cured resin having a thickness of 70 µm was used as a reference surface 225 (FIG. 4(b)). Surface grinding was performed on a first surface 204 of the wafer 200 to a surface indicated by a broken line 421, the wafer 200 held by suction by using the surface of the resin as the reference surface 225 (FIG. 4(c)). The resin was torn (FIG. 4(d)), and surface grinding was performed on the second surface 205 of the wafer 200 to a surface indicated by a broken line 451, the wafer 200 held by suction by using the first surface 204 of the wafer 200 as a reference surface 251 (FIG. 4(e)). The wafer 200 in this state was used as the wafer 200 of Comparative Example 1 (FIG. 4(f)).

Comparative Example 2

As for Comparative Example 2, the wafer 200 after lapping depicted in FIG. 3(b) of Example was used as the wafer 200 of Comparative Example 2.

<Evaluation Test 1>

Figure 5:
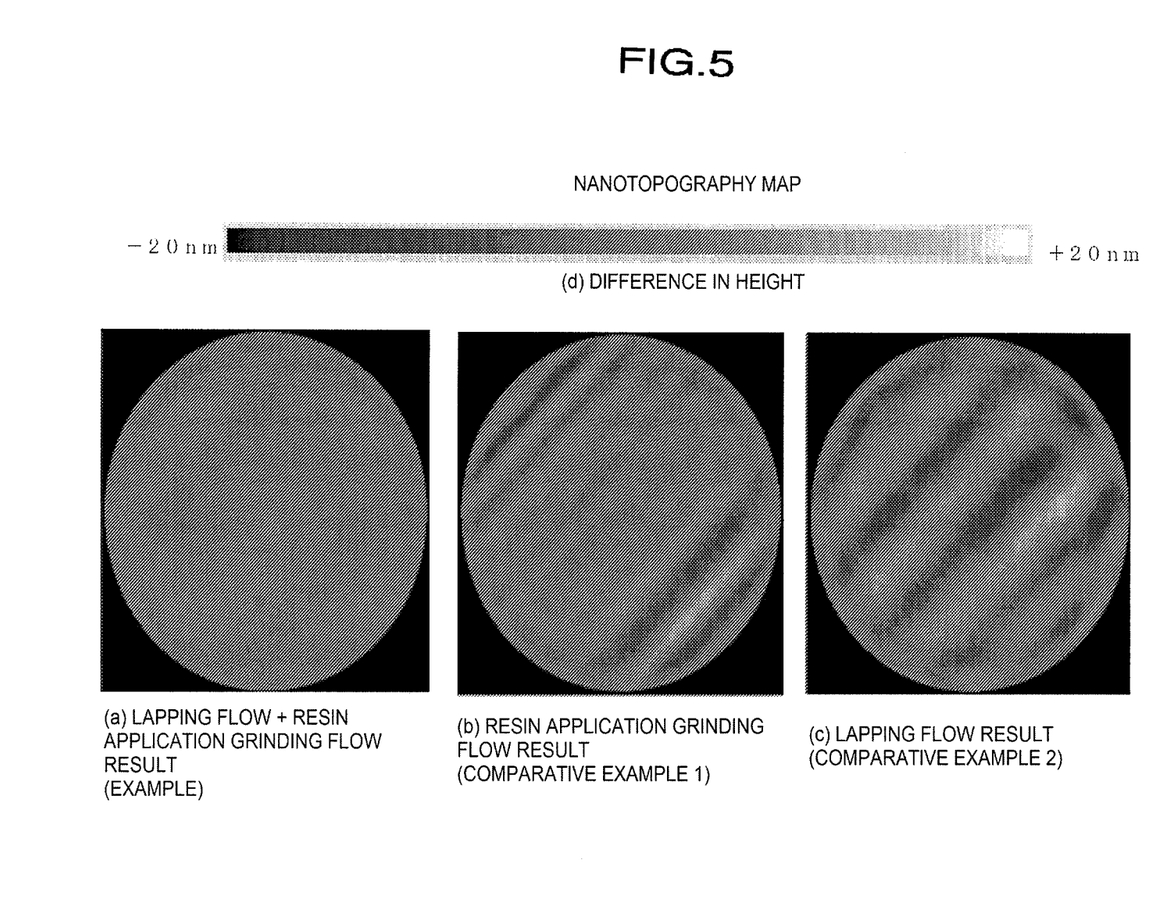
FIG. 5 depicts the nanotopography after mirror-polishing of Example and Comparative Examples 1 and 2.

A study was conducted to determine the influence of the surface shapes of the wafers 200 obtained in Example and Comparative Examples 1 and 2 on the nanotopography on the wafer surface subjected to mirror-polishing processing which was subsequently performed. Specifically, first, for each of the wafers 200 obtained in Example and Comparative Examples 1 and 2, after rough polishing processing under the same condition was performed on front and back surfaces of each wafer by using a double-side polishing apparatus as common mirror-polishing processing, finishing polishing processing under the same condition was performed on each wafer surface by using a single-side polishing apparatus, and wafers obtained as a result of the surfaces of the wafers 200 were mirror-polished were prepared. FIG. 5 is a nanotopography map obtained by measuring the height distribution (a difference in height) of each mirror-polished wafer surface by using an optical interferometric flatness measuring device (KLA-Tencor Corporation: Wafersight2) and illustrates the nanotopography measurement results with gradation after the removal of a long-wavelength component by performing filtering processing on the measurement results of the wafers following mirror-polishing processing. FIG. 5(d) is a diagram depicting a difference in height of the nanotopography depicted in FIGS. 5(a) to (c), the darker, the lower the height, and the darkest portion is located −20 nm away from the central height; the lighter, the higher the height, and the lightest portion is located +20 nm away from the central height. A difference in height between the lowest height and the highest height is 40 nm. Incidentally, the measurement of nanotopography was conducted by fixing arbitrary three points at the outer edge of the wafer. Therefore, the nanotopography map indicates a difference in height on the surface of the wafer in a non-sticking state.

The result of Example is depicted in FIG. 5(a). The result reveals that the density is almost uniform and a difference in height is small on the whole surface. The reason for this can be considered as follows: even when the resin is removed after the first surface 204 of the wafer 200 is ground and the first surface 204 of the wafer 200 becomes a highly planarized surface, since the waves 202 in the wavelength range of 100 mm or less, in particular, 50 mm or less are reduced by lapping, the first surface 204 of the wafer 200 maintains the highly planarized surface, and, even when surface grinding is performed on the second surface 205 of the wafer 200 with the first surface 204 of the wafer 200 being stuck as the reference surface 251, since the wafer 200 is not elastically deformed when the first surface 204 of the wafer 200 is stuck, the waves 202 do not appear on the second surface 205 of the wafer 200 after the release of sticking of the first surface 204 of the wafer 200.

The result of Comparative Example 1 is depicted in FIG. 5(b). Although a central portion of FIG. 5(b) is slightly planarized, the waves 202 remain. The reason for this is considered as follows: although the first surface 204 of the wafer 200 is highly planarized immediately after surface grinding is performed on the first surface 204 of the wafer 200 in FIG. 4(c), since the stress applied to the first surface 204 by the waves 202 is eliminated and a balance with the stress applied by the waves 202 remaining in the second surface 205 of the wafer 200 after the resin is torn is lost, the first surface 204 is deformed. In addition, it can be considered that, when the first surface 204 of the wafer 200 is stuck as the reference surface 251, the wafer 200 is elastically deformed by sticking, and, even when surface grinding is then performed on the second surface 205 and the second surface 205 becomes a highly planarized surface, when the wafer 200 is released from sticking, the first surface 204 of the wafer 200 is released from the elastic deformation caused by sticking and the waves 202 appear in the second surface 205 of the wafer 200.

The result of Comparative Example 2 is depicted in FIG. 5(c). The waves 202 remain on the whole surface.

<Evaluation Test 2>

Figure 6:
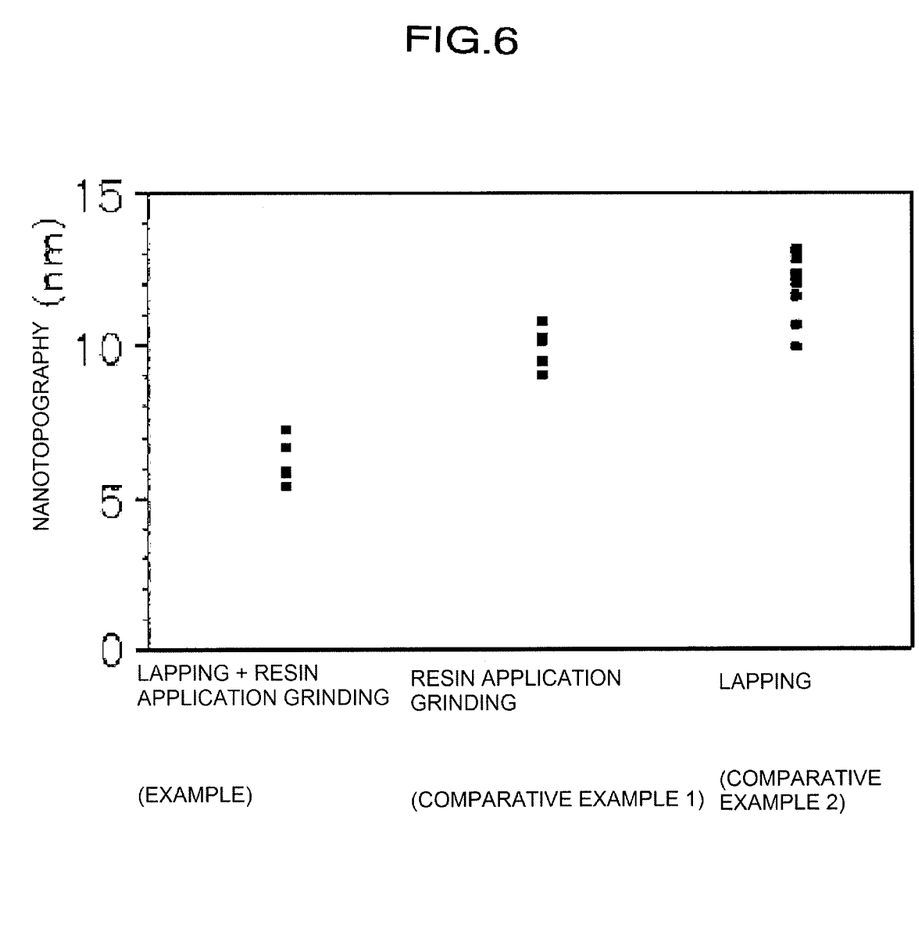
FIG. 6 is a diagram depicting the nanotopography after mirror-polishing of Example and Comparative Examples 1 and 2.

As is the case in Evaluation Test 1, a study was conducted to determine the influence of the surface shapes of the wafers 200 on the nanotopography on the wafer surface subjected to mirror-polishing processing. In this test, a plurality of wafers 200 under the same conditions as those of Example and Comparative Examples 1 and 2 were produced, mirror-polishing processing under the same condition as that of Evaluation Test 1 (rough polishing processing using the double-side polishing apparatus+finishing polishing processing using the single-side polishing apparatus) was performed on each of the plurality of wafers 200, and the wafers obtained as a result of the surfaces of the wafers 200 were subjected to mirror-polishing were prepared. FIG. 6 is obtained by measuring the nanotopography of each mirror-polished wafer surface by using the optical interferometric flatness measuring device (KLA-Tencor Corporation: Wafersight2) and depicting them in individual graphs. Specifically, FIG. 6 is obtained by calculating a maximum PV value for each of the sites divided by circular regions with a diameter of 2 mm on each mirror-polished wafer surface and plotting the largest PV value of the maximum PV values calculated in the sites as a representative value.

As is clear from FIG. 6, in Example, a difference in height was in the range of 5.4 to 7.2 nm, in Comparative Example 1, a difference in height was in the range of 9.0 to 10.7 nm, and, in Comparative Example 2, a difference in height was in the range of 9.8 to 13.0 nm. The wafer of Example made it possible to obtain a highly planarized surface in which the nanotopography on the whole of the surface thereof was 8 nm or less.

<Evaluation Test 3>

Figure 7:
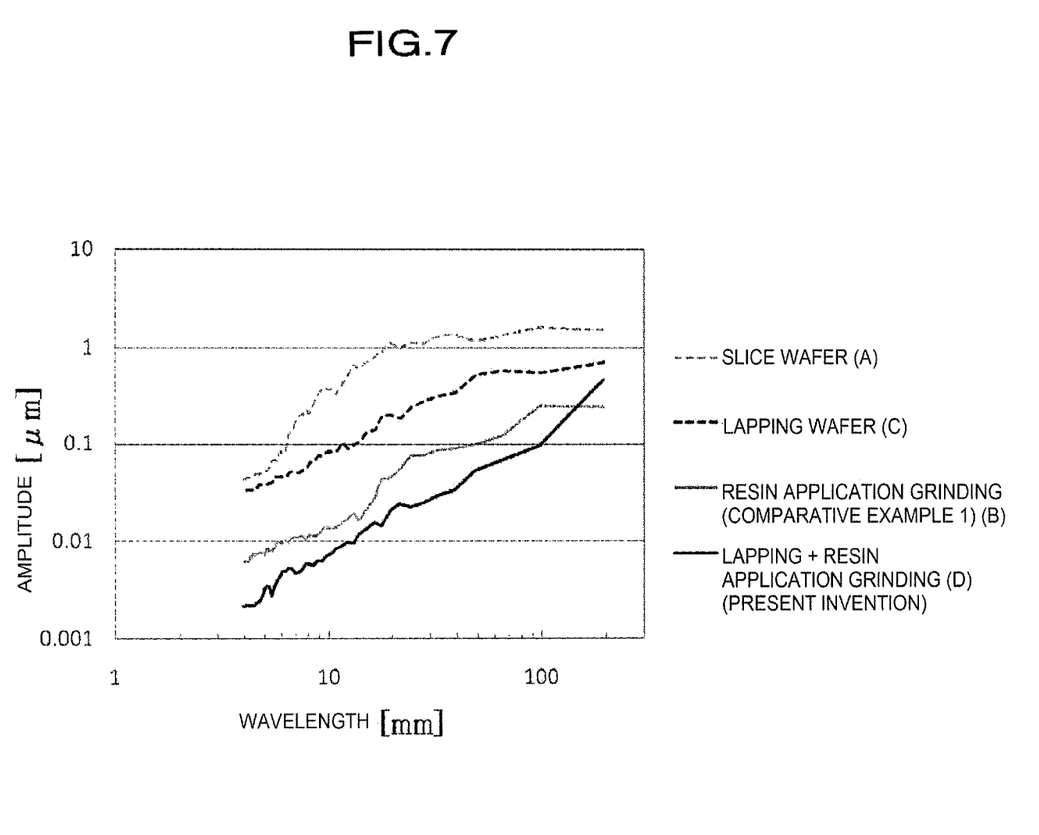
FIG. 7 is a diagram depicting the frequency analysis results before mirror-polishing of Example and Comparative Examples 1 and 2.

Next, frequency analysis was performed on the surface height of each wafer 200 prior to mirror-polishing processing, and the amplitude of the wavelength of a wave component was examined. The results are depicted in FIG. 7. FIG. 7 depicts the results of the frequency analysis performed on the wafer surface height by using an electrostatic capacitive shape measuring device (KOBELCO Research Institute, Inc.: SBW) on each of the wafer (A) after slicing depicted in FIG. 3(a), the wafer (B) subjected to resin application grinding after slicing (Comparative Example 1) depicted in FIG. 4(f), the wafer (C) after lapping (Comparative Example 2) depicted in FIG. 3(b), and the wafer (D) subjected to resin application grinding after lapping (Example) depicted in FIG. 3(g). The analysis method was as follows: band-pass filtering processing was performed on the wafer surface height measurement data by cutting off a wavelength band with a short-wavelength periodic component of less than 10 mm and a long-wavelength periodic component of more than 100 mm and the amplitude of the wavelength of the wave component in the wavelength region of 10 to 100 mm was obtained.

As is clear from FIG. 7, while, in the wafer (A) after slicing, an amplitude of up to 1.7 μm was observed and a region in which an amplitude exceeding 1 μm was generated was observed, in the wafer (C) subjected to lapping processing (Comparative Example 2), the amplitude was 0.4 Km at a maximum and the amplitude was 1 Km or less in all the wavelength regions of 100 mm or less, which reveals that the amplitude can be greatly reduced by lapping processing. Moreover, it is revealed that the amplitude is reduced to a larger extent in the wafer (D) subjected to resin application grinding after lapping (Example) than in the wafer (B) subjected to resin application grinding after slicing (Comparative Example 1).

<Evaluation Test 4>

Next, after mirror-polishing processing similar to the mirror-polishing processing performed in Evaluation Test 1 was performed on each wafer 200, frequency analysis was performed on the surface height of each mirror-polished wafer 200, and the amplitude of the wavelength of the wave component was examined. The results are depicted in FIG. 8.

Figure 8:
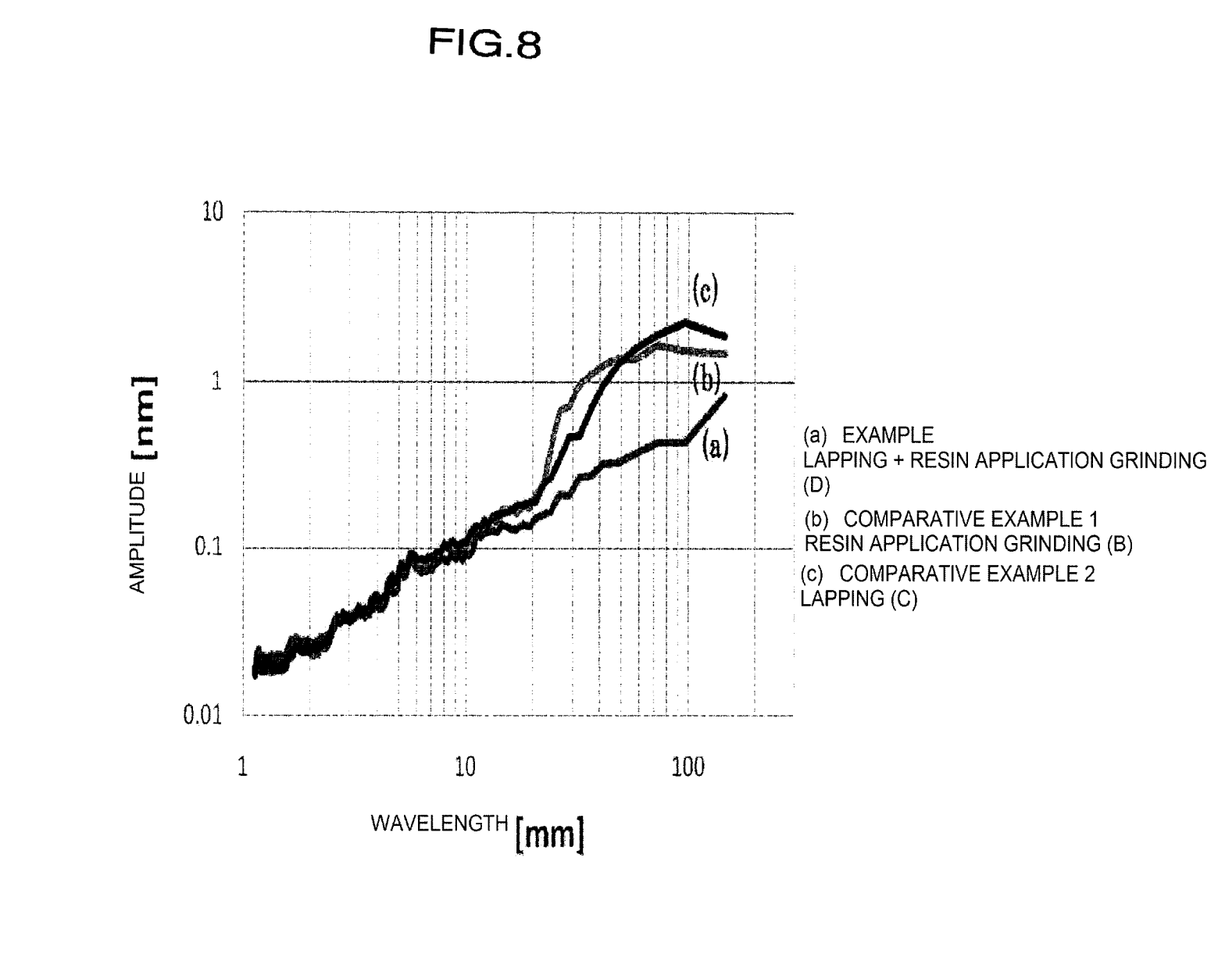
FIG. 8 is a diagram depicting the frequency analysis results after mirror-polishing of Example and Comparative Examples 1 and 2.

FIG. 8 depicts the results of the frequency analysis performed on the wafer surface height after mirror-polishing by using the optical interferometric flatness measuring device (KLA-Tencor Corporation: Wafersight2) on each of the wafer (B) subjected to resin application grinding after slicing (Comparative Example 1) depicted in FIG. 4(f), the wafer (C) after lapping (Comparative Example 2) depicted in FIG. 3(b), and the wafer (D) subjected to resin application grinding after lapping (Example) depicted in FIG. 3(g). The analysis method was as follows: a long-wavelength periodic component of a wave was cut by Gaussian filter processing with a cutoff value of 20 mm performed on the wafer surface height measurement data and Fourier transform was performed on the wafer surface height subjected to filtering, whereby the amplitude of the wavelength of the wave component in the wavelength region of 100 mm or less was obtained.

As is clear from FIG. 8, while, when the wafer (D) subjected to resin application grinding after lapping (Example) was used, in the result of the frequency analysis of the wafer surface after mirror-polishing processing, the amplitude of the wave in the wavelength region of 10 to 100 mm was 0.4 nm or less and was extremely good, the amplitude of up to 1.7 nm was observed when the wafer (B) subjected to resin application grinding after slicing (Comparative Example 1) was used and the amplitude of up to 2 nm was observed when the wafer (C) subjected to lapping processing (Comparative Example 2) was used.

INDUSTRIAL APPLICABILITY

The method for processing a semiconductor wafer of the present invention can be used in a step of planarizing the surface of a wafer obtained by slicing an ingot formed of silicon, gallium or the like.

EXPLANATIONS OF LETTERS OR NUMERALS 200 wafer
221 curable material
232 reference surface

The invention claimed is:

1. A method for processing a semiconductor wafer, the method comprising:
    slicing a semiconductor single-crystal ingot by using a wire saw apparatus to obtain a thin disk-shaped wafer having one surface and another surface that is opposite the one surface;
    performing planarization on the one surface and the another surface of the wafer at the same time during a double-side planarization that follows the slicing;
    forming a flat application layer by applying a curable material to the whole of the one surface of the wafer following the double-side planarization;
    in a first surface grinding stage, placing the wafer on a table in such a way that a surface of the application layer makes contact with a reference surface of the table of a grinding device and then performing surface grinding, via the grinding device, on the another surface that is opposite to the one surface of the wafer;
    removing the application layer from the one surface of the wafer following the first surface grinding stage; and
    in a second surface grinding stage, placing the wafer on the table in such a way that the another surface of the wafer makes contact with the reference surface of the table of the grinding device and then performing surface grinding, via the grinding device, on the one surface of the wafer from which the application layer is removed, wherein
    the planarization of the one surface of the wafer and the another surface of the wafer is performed such that an amplitude of a wave in a wavelength region of 100 mm or less is within the range of 1.0 µm or less as measured by a frequency analysis performed on a surface height of the wafer following the double-side planarization.

2. The method for processing a semiconductor wafer according to claim 1, wherein
    the wire saw apparatus is of a slicing type using a fixed abrasive grain wire.

3. The method for processing a semiconductor wafer according to claim 1, wherein
    the double-side planarization is double-side lapping processing or double-head grinding processing.

4. The method for processing a semiconductor wafer according to claim 1, wherein
    a thickness of the application layer which is applied to the wafer surface in the formation of the application layer is 10 to 40 µm.

5. The method for processing a semiconductor wafer according to claim 1, wherein the wavelength region is in a range of 10 mm to 100 mm.

* * * * *